US008865581B2

(12) United States Patent
Clark

(10) Patent No.: US 8,865,581 B2
(45) Date of Patent: Oct. 21, 2014

(54) HYBRID GATE LAST INTEGRATION SCHEME FOR MULTI-LAYER HIGH-K GATE STACKS

(71) Applicant: Tokyo Electron Limited, Tokyo (JP)

(72) Inventor: Robert D. Clark, Livermore, CA (US)

(73) Assignee: Tokyo Electron Limited, Tokyo (JP)

( * ) Notice: Subject to any disclaimer, the term of this patent is extended or adjusted under 35 U.S.C. 154(b) by 52 days.

(21) Appl. No.: 13/656,537

(22) Filed: Oct. 19, 2012

(65) Prior Publication Data
US 2014/0110791 A1    Apr. 24, 2014

(51) Int. Cl.
*H01L 21/8238* (2006.01)

(52) U.S. Cl.
USPC .............................. 438/591; 438/183; 438/287

(58) Field of Classification Search
CPC ............... H01L 21/823857; H01L 21/823842; H01L 29/517; H01L 29/66545
USPC ................................... 438/183, 199, 287, 591
See application file for complete search history.

(56) References Cited

U.S. PATENT DOCUMENTS

| 6,407,435 | B1 | 6/2002 | Ma et al. |
|---|---|---|---|
| 6,617,639 | B1 | 9/2003 | Wang et al. |
| 6,642,131 | B2 | 11/2003 | Harada |
| 6,939,611 | B2 | 9/2005 | Fujishima et al. |
| 7,091,568 | B2 | 8/2006 | Hegde et al. |
| 7,176,531 | B1 | 2/2007 | Xiang et al. |
| 7,226,831 | B1 | 6/2007 | Metz et al. |
| 7,446,380 | B2 | 11/2008 | Bojarczuk et al. |
| 7,772,073 | B2 | 8/2010 | Clark et al. |
| 7,888,195 | B2 * | 2/2011 | Lin et al. ........................ 438/199 |
| 7,952,118 | B2 | 5/2011 | Jung et al. |
| 8,012,827 | B2 | 9/2011 | Yu et al. |
| 8,202,773 | B2 | 6/2012 | Niimi et al. |
| 8,445,344 | B2 * | 5/2013 | Carter et al. ................... 438/216 |
| 2002/0047170 | A1 | 4/2002 | Ota |
| 2002/0172768 | A1 | 11/2002 | Endo et al. |
| 2003/0052374 | A1 | 3/2003 | Lee et al. |
| 2005/0098839 | A1 | 5/2005 | Lee et al. |
| 2005/0238886 | A1 | 10/2005 | Gallego |
| 2005/0245016 | A1 | 11/2005 | Pan et al. |
| 2006/0054943 | A1 | 3/2006 | Li et al. |
| 2006/0081901 | A1 | 4/2006 | Arimoto et al. |

(Continued)

OTHER PUBLICATIONS

Xinyuan Zhao, et al., "First-Principles Study of Electronic and Dielectric Properties of ZrO2 and HfO2", Mat. Res. Soc. Symp. Proc. vol. 745 .Copyrgt. 2003 Materials Research Society, pp. 283-289.

(Continued)

*Primary Examiner* — John C Ingham

(57) ABSTRACT

A method for manufacturing a dual workfunction semiconductor device using a hybrid gate last integration scheme is described. According to one embodiment, the method includes heat-treating a first high-k film at a first heat-treating temperature to diffuse a first chemical element from a first cap layer into the first high-k film in a device region to form a first modified high-k film. The method further includes a gate-last processing scheme to form recessed features defined by sidewall spacers in the device regions and depositing a second high-k film in the recessed features. Some embodiments include forming an oxygen scavenging layer on the first high-k film, where the heat-treating the first high-k film scavenges oxygen from an interface layer to eliminate or reduce the thickness of an interface layer.

21 Claims, 7 Drawing Sheets

(56) References Cited

U.S. PATENT DOCUMENTS

| | | |
|---|---|---|
| 2006/0118890 A1 | 6/2006 | Li |
| 2006/0151823 A1 | 7/2006 | Govindarajan |
| 2006/0189154 A1 | 8/2006 | Ahn et al. |
| 2006/0189156 A1 | 8/2006 | Doczy et al. |
| 2006/0289948 A1 | 12/2006 | Brown et al. |
| 2007/0032021 A1 | 2/2007 | Park |
| 2007/0085154 A1 | 4/2007 | Murakawa et al. |
| 2007/0178634 A1 | 8/2007 | Jung et al. |
| 2007/0237697 A1 | 10/2007 | Clark |
| 2008/0081113 A1 | 4/2008 | Clark |
| 2008/0116543 A1 | 5/2008 | Govindarajan |
| 2008/0121963 A1 | 5/2008 | Govindarajan |
| 2009/0047798 A1 | 2/2009 | Clark et al. |
| 2009/0108294 A1 | 4/2009 | Choi et al. |
| 2009/0152650 A1 | 6/2009 | Chudzik et al. |
| 2010/0044806 A1 | 2/2010 | Hou et al. |
| 2010/0048010 A1 | 2/2010 | Chen et al. |
| 2010/0072531 A1 | 3/2010 | Kitti et al. |
| 2010/0127336 A1 | 5/2010 | Chambers et al. |
| 2010/0187644 A1 | 7/2010 | Nabatame |
| 2010/0187982 A1 | 7/2010 | Hsu et al. |
| 2010/0197128 A1 | 8/2010 | Schaeffer et al. |
| 2010/0258878 A1 | 10/2010 | Mise et al. |
| 2010/0320547 A1 | 12/2010 | Ando et al. |
| 2010/0327373 A1 | 12/2010 | Carter et al. |
| 2011/0115027 A1 | 5/2011 | Jagannathan et al. |
| 2011/0127616 A1 | 6/2011 | Hoentschel et al. |
| 2012/0018810 A1 | 1/2012 | Chambers et al. |
| 2012/0083110 A1 | 4/2012 | Huguenin et al. |
| 2012/0100684 A1 | 4/2012 | Min et al. |
| 2012/0119204 A1 | 5/2012 | Wong et al. |
| 2012/0132998 A1 | 5/2012 | Kwon et al. |
| 2012/0280288 A1 | 11/2012 | Ando et al. |

OTHER PUBLICATIONS

Kamimuta et al., "Systematic Study of Vfb Shift in Stacked High-k Bi-layers with Cycle-by-Cycle ALD" Presentation at the ALD 2007 Conference, Jun. 27, 2007 (18 pp).

R. I. Hegde, et al., "Microstructure Modified HfO2 Using Zr Addition With TaxCy Gate for Improved Device Performance and Reliability", IEEE, 2005, (4 pages).

C. Zhao, et al., "Crystallization and Tetragonal-Monoclinic Transformation in ZrO2 and HfO2 Dielectric Thin Films", Key Engineering Materials vols. 206-213 (2002), pp. 1285-1288.

Y. Kuo, et al., "Sub 2 NM Thick Zirconium Doped Hafnium Oxide High-K Gate Dielectrics", ECS Transactions, The Electrochemical Society, 2006, pp. 447-454.

Kyoung-Ryul Yoon, et al., "Performance and Reliability of MIM (Metal-Insulator-Metal Capacitors With ZrO2 for 50nm DRAM Application", Extended Abstracts of the 2005 International Conference on Solid State Devices and Materials, Kobe, 2005, pp. 188-189.

Hyoungsub Kim, et al., "Comparative Study on Electrical and Microstructural Characteristics of ZrO2 and HfO2 Grown by Atomic Layer Deposition", J. Mater. Res., vol. 20, No. 11, Nov. 2005, Copyrgt. Material Research Society, pp. 3125-3132.

Y. Kuo, et al., "Sub 2 nm Thick Zirconium Doped Hafnium Oxide High-K Gate Dielectrics", 208th ECS Meeting (Oct. 19, 2005), Abstract #548, 1 page.

Tsunehiro Ino, et al., "Dielectric Constant Behavior of Oriented Tetragonal Zr-Si-O System", Extended Abstracts of the 2006 International Conference on Solid State Devices and Materials, Yokohama 2006, pp. 404-405.

Xinyuan Zhao, et al., "Phonons and Lattice Dielectric Properties of Zirconia", Physical Review B. vol. 65 (2002), pp. 075105-1-075105-10.

G. M. Rignanese, et al., "First-Principles Investigation of High-K Dielectrics: Comparison Between the Silicates and Oxides of Hafnium and Zirconium", Physical Review B 69, 2004, pp. 184301-1-184301-10.

H. Y. Yu, et al., "Physical and Electrical Characteristics of HfN Gate Electrode for Advanced MOS Devices", IEEE Electron Device Letters, vol. 24, No. 4, Apr. 2003, pp. 230-232.

Kamimuta et al., "Systematic Study of Vfb Shift in Stacked High-k Bi-layers with Cycle-by-Cycle ALD", Abstract, 7th International Conference on Atomic Layer Deposition, Jun. 24-27, 2007, San Diego, CA (1 pp).

U.S. Appl. No. 13/215,431, filed Aug. 23, 2011.

U.S. Appl. No. 13/436,552, filed Mar. 30, 2012.

U.S. Appl. No. 13/363,765, filed Feb. 1, 2012.

Choi et al. "Scaling equivalent oxide thickness with flat band voltage (Vfb) modulation using in situ Ti and Hf interposed in a metal/high-k gate stack," Journal of Applied Physics 108 (2010) pp. 064107-1-064107-4.

Ando et al. "Ultimate EOT Scaling (<5A) Using Hf-based High-k Gate Dielectrics and Impact on Carrier Mobility," ECS Transactions 28(1) (2010) pp. 115-123.

European Patent Office, Partial International Search for corresponding International Patent Application Serial No. PCT/US2013/062982, mailed Feb. 4, 2014, 5 pages.

\* cited by examiner

HYBRID GATE LAST INTEGRATION SCHEME FOR MULTI-LAYER HIGH-K GATE STACKS

FIELD OF INVENTION

The present invention relates to manufacturing semiconductor devices. More particularly, the present invention relates to methods for manufacturing semiconductor devices containing gate stacks comprising high-k materials and a metal-containing gate electrode and the semiconductor devices made thereof.

BACKGROUND OF THE INVENTION

As the size and scaling of semiconductor device technology is reduced, aspects of device design and fabrication that previously gave rise to only second-order effects in long-channel devices can no longer be ignored. For example, the reduced scaling of channel length and gate oxide thickness in a conventional complementary metal-oxide-semiconductor (CMOS) transistor exacerbates problems of polysilicon gate depletion, high gate resistance, high gate tunneling leakage current and boron penetration into the channel region of the device. As a result, CMOS technology is increasingly replacing silicon dioxide gate dielectrics and polysilicon gate conductors with high dielectric constant (high-k) gate dielectrics in combination with metal-containing gate electrodes.

Scaling of the gate dielectric is a challenge in improving performance of advanced field effect transistors. A high-k gate dielectric has a higher dielectric constant (k) than $SiO_2$ (~3.9) and provides a way of scaling down the effective oxide thickness (EOT) of the gate dielectric without an excessive increase in the gate leakage current. While high-k dielectrics in conjunction with low sheet resistance metal gate electrodes advantageously exhibit improved transistor performance, the use of new metal layer technologies can create new technical challenges. For example, to optimize drain current and device performance and reduce the threshold voltage Vt, the desired effective work function for negative channel metal-oxide-semiconductor (NMOS) and positive channel metal-oxide-semiconductor (PMOS)) gate electrodes must be near the conduction (or valence) band edge of silicon, meaning that the metals used in NMOS transistors should have effective work functions near 4.1 eV and metals used in PMOS transistors should have effective work functions near 5.2 eV. Since it is difficult to find a material that can have its work function adjusted once it is deposited, approaches for obtaining differentiated work functions have involved forming separate gate electrode layers, such as by removing a deposited first metal gate layer from the gate insulator to deposit a second metal gate layer having a different work function. Such processes can damage the gate insulator layer, leading to high leakage or reliability problems for the finally formed device. Another method for obtaining different work functions involves formation of two gate stacks of unbalanced height which can be a major challenge for the subsequent gate etch process.

SUMMARY OF THE INVENTION

A method is provided for forming semiconductor devices containing high-k gate dielectrics and a metal-containing gate electrode. The method provides a hybrid gate last integration scheme for multilayer high-k gate stacks that allow for a combination of a high thermal budget that is typical in gate-first integration schemes and a low thermal budget that is typical in gate-last integration schemes.

According to one embodiment of the invention, the method includes providing a substrate containing first and second device regions and an interface layer on the substrate, depositing a first high-k film on the interface layer in the first and second device regions, forming a first cap layer containing a first chemical element on the first high-k film in the first device region, and depositing a replacement gate electrode film in the first and second device regions. The method further includes heat-treating the first high-k film at a first heat-treating temperature to diffuse the first chemical element from the first cap layer into the first high-k film in the first device region to form a first modified high-k film, patterning the replacement gate electrode film in the first and second device regions, forming sidewall spacers adjacent the patterned replacement gate electrode film, and removing the patterned replacement gate electrode film to form recessed features defined by the sidewall spacers in the first and second device regions. The method still further includes depositing a second high-k film in the recessed features and depositing a gate metal film on the second high-k film. The second high-k film may be heat-treated at a second heat-treating temperature that is lower than the first heat-treating temperature.

DETAILED DESCRIPTION OF SEVERAL EMBODIMENTS

Figure 1A:
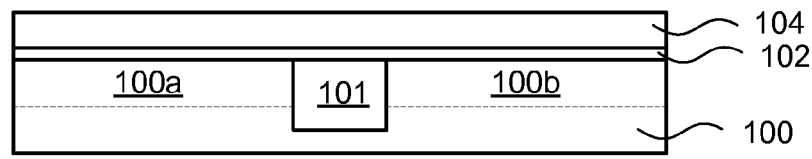
FIGS. 1A-1H show schematic cross-sectional views of a process flow for forming a semiconductor device according to an embodiment of the invention.

Embodiments of the invention describe methods for manufacturing semiconductor devices containing gate stacks comprising high-k materials and a metal-containing gate electrode and the semiconductor devices made thereof.

One skilled in the relevant art will recognize that the various embodiments may be practiced without one or more of the specific details described herein, or with other replacement and/or additional methods, materials, or components. In other instances, well-known structures, materials, or operations are not shown or described in detail herein to avoid obscuring aspects of various embodiments of the invention. Similarly, for purposes of explanation, specific numbers, materials, and configurations are set forth herein in order to provide a thorough understanding of the invention. Furthermore, it is understood that the various embodiments shown in the figures are illustrative representations and are not drawn to scale.

Reference throughout this specification to "one embodiment" means that a particular feature, structure, material, or characteristic described in connection with the embodiment is included in at least one embodiment of the invention, but does not denote that it is present in every embodiment.

In a CMOS device, the gate requires a threshold voltage (Vt) to make the channel region conductive. To establish threshold voltage (Vt) values, the effective work function differences of the respective PMOS and NMOS gate materials (gate stacks) and their corresponding channel regions are independently established through channel processing and gate processing. In other words, both gate dielectric (consisting i.e. of one or more dielectric materials) and gate electrode (consisting i.e. of at least one metal layer) determine the effective work function of the gate stack (device). Moreover, the gate processing itself (i.e. the sequence of the different processes and/or the thermal treatments applied) may have an influence on the effective work function of the gate stack (device).

The effective work function of a gate stack (device) is a parameter that can be tuned (adjusted/modified) by the choice of the gate dielectric materials, gate electrode materials and by the gate processing performed. On the contrary, the work function (WF) of the gate electrode is an intrinsic property of the material. In general, the work function of a certain material (i.e., a metal layer) is a measure of the energy, in electron volts (eV), required to eject an electron in the material outside of a material atom to the vacuum, if the electron were initially at the Fermi level. The work function of the gate electrode may also be referred to as as-deposited workfunction or the intrinsic workfunction of the material.

FIGS. 1A-1H show schematic cross-sectional views of a process flow for forming a semiconductor device according to an embodiment of the invention. The process flow provides a method for manufacturing a dual workfunction semiconductor device using a hybrid gate last integration scheme for multilayer high-k gate stacks that allows for a combination of a high thermal budget that is typical in gate-first integration schemes and a low thermal budget that is typical in gate-last integration schemes.

FIG. 1A schematically shows a substrate 100 containing a first device region 100a (e.g., a NMOS or PMOS region) and a second device region 100b (e.g., a PMOS or NMOS region) that are separated by a shallow trench isolation (STI) 101. Depending on the type of device being fabricated, the substrate 100 and the device regions 100a/100b may contain bulk silicon substrate, single crystal silicon (doped or undoped), semiconductor on insulator (SOI) substrate, or any other semiconductor material including, for example, Si, SiC, SiGe, SiGeC, Ge, GaAs, InAs, InP, as well as other III/V or II/VI compound semiconductors or any combinations thereof. The substrate 100 can be of any size, for example a 200 mm substrate, a 300 mm substrate, a 450 mm substrate, or an even larger substrate. In one example, the substrate 100 can include a tensile-strained Si layer. According to another embodiment, the substrate 100 may contain Ge or $Si_xGe_{1-x}$ compounds, where x is the atomic fraction of Si, 1-x is the atomic fraction of Ge, and 0<1-x<1. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the substrate 100 can contain a compressive-strained Ge layer or a tensile-strained $Si_xGe_{1-x}$ (x>0.5) deposited on a relaxed $Si_{0.5}Ge_{0.5}$ buffer layer. In one example, the substrate 100 includes Si and a PMOS device region 100b contains $Si_xGe_{1-x}$.

The STI 101 is formed to electrically isolate the first device region 100a from the second device region 100b and the STI 101 horizontally defines boundaries of the device regions 100a and 100b. The STI 101 may be formed using conventional methods, for example by selectively etching an opening in the substrate 100 using a patterned mask or photoresist, depositing silicon oxide or silicon nitride to fill the opening, and then planarizing the oxide or nitride.

FIG. 1A further shows an interface layer 102 that is formed on the first device region 100a and on the second device region 100b. The interface layer 102 can, for example, contain a high mobility, low defect oxide (e.g., $SiO_2$). The interface layer 102 may be a chemical oxide formed by oxidizing a surface of substrate 100 in an aqueous bath (e.g., a bath containing deionized (DI) water and ozone ($O_3$)), an oxide formed by oxidation of a surface of substrate 100 during or following the deposition of a high-k material, or an oxide deposited onto a surface of substrate 100 by gas phase deposition using reactant gases. The interface layer 102 can have a thickness between about 6 Angstrom and about 15 Angstrom, for example.

FIG. 1A further shows a first high-k film 104 formed on the interface layer 102. The interface layer 102 has a lower dielectric constant than the first high-k film 104 and, therefore, the presence of the interface layer 102 increases the effective oxide thickness (EOT) of the combination of the interface layer 102 and the first high-k film 104. The first high-k film 104 can contain hafnium, zirconium, or hafnium and zirconium, including hafnium oxide ($HfO_2$), hafnium oxynitride (HfON), hafnium silicate (HfSiO), hafnium silicon oxynitride (HfSiON), zirconium oxide ($ZrO_2$), zirconium oxynitride (ZrON), zirconium silicate (ZrSiO), zirconium silicon oxynitride (ZrSiON), hafnium zirconium oxide ($HfZrO_2$), hafnium zirconium oxynitride (HfZrON), hafnium zirconium silicate (HfZrSiO), hafnium zirconium silicon oxynitride (HfZrSiON), or a combination of two or more thereof.

According to some embodiments, the first high-k film 104 can contain an oxide, oxynitride, or titanate layer containing one or more elements selected from Group II (beryllium (Be), magnesium (Mg), calcium (Ca), strontium (Sr), and barium (Ba)), and one or more elements selected from rare earth metals of the Periodic Table of the Elements. Rare earth metals include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Examples of rare earth metal oxides include yttrium oxide ($Y_2O_3$), lanthanum oxide ($La_2O_3$) and lutetium oxide ($Lu_2O_3$). Examples of titanate layers include barium titanate ($BaTiO_3$), strontium titanate ($SrTiO_3$), and barium strontium titanate ($BaSrTiO_3$).

According to embodiments of the invention, the first high-k film 104 may be deposited by atomic layer deposition (ALD), plasma-enhanced ALD (PEALD), chemical vapor deposition (CVD), or plasma-enhanced CVD (PECVD). According to one embodiment of the invention, ALD or PEALD may be utilized due to normally superior uniformity and atomic level thickness control compared to CVD and PECVD methods. A thickness of the first high-k film 104 can, for example, be at least 2 Angstrom, between about 2 Angstrom and about 60 Angstrom, between about 5 Angstrom and about 30 Angstrom, or between about 5 Angstrom and about 15 Angstrom.

Figure 1B:
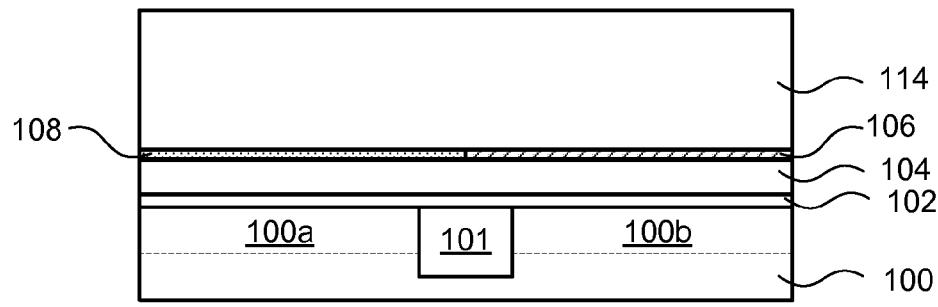

FIG. 1B shows a first cap layer 108 that is selectively formed on the first high-k film 104 over the first device region 100a and a second cap layer 106 that is selectively formed on the first high-k film 104 over the second device region 100b. The first cap layer 108 contains a first chemical element for diffusion into the first high-k film 104 during a high-temperature heat-treating process, thereby chemically modifying the first high-k film 104 in the first device region 100a. According to one embodiment, the first cap layer 108 can include a metal or a dielectric material containing a first chemical element selected from Mg, Ca, Sr, Ba, Sc, Y, La, Ce, Pr, Nd, Pm, Sm, Eu, Gd, Tb, Dy, Ho, Er, Tm, Yb, or Lu, or a combination thereof. The dielectric material can contain a metal oxide, a metal nitride, or a metal oxynitride, or a combination thereof. Examples of rare earth metal oxides include yttrium oxide ($Y_2O_3$), lanthanium oxide ($La_2O_3$) and lutetium oxide ($Lu_2O_3$). The second cap layer 106 contains a second chemical element for diffusion into the first high-k film 104 during the high-temperature heat-treating process, thereby chemically modifying the first high-k film 104 in the second device region 100b. According to embodiments of the invention, the second cap layer 106 has a different chemical composition than the first high-k film 104 and the first cap layer 108, and the second chemical element is different from the first chemical element. The second cap layer 106 can include a metal layer (i.e., zero valent metal). The second chemical element may be selected from Ti, Ta, Al, Ga, Mg, Ca Sr, Ba, Sc, Y, La, Ce, Pr, Nd, Pm, Sm, Eu, Gd, Tb, Dy, Ho, Er, Tm, Yb, or Lu, or a combination thereof.

The first cap layer 108 and the second cap layer 106 may be deposited by atomic layer deposition (ALD), plasma-enhanced ALD (PEALD), chemical vapor deposition (CVD), plasma-enhanced CVD (PECVD), or sputtering. A thickness of the first cap layer 108 and the second cap layer 106 can, for example, be between about 5 Angstrom and about 200 Angstrom, between about 10 Angstrom and about 30 Angstrom, between about 30 Angstrom and about 100 Angstrom, or between about 100 Angstrom and about 200 Angstrom. The thicknesses of the first cap layer 108 and second cap layer 106 may be selected to provide an adequate supply of the first and second chemical elements for diffusion into the first high-k film 104 in the first device region 100a and in the second device region 100b to reach a targeted threshold voltage shift. In other words, the thicker the first cap layer 108 and the second cap layer 106, the greater the available supply of the first and second chemical elements.

The first cap layer 108 and the second cap layer 106 may be selectively formed on the first high-k film 104 by standard lithography and etching methods that can utilize a patterned mask. The pattern transfer may use one or more etching steps to remove the unprotected portions of the first cap layer 108 and the second cap layer 106 above the first high-k film 104. The one or more etching steps can, for example, include plasma etching, reactive ion etching (RIE), or wet etching using an etchant species in liquid solution. The patterned mask can contain photoresist. In some examples, the patterned mask can contain an organic mask or silicon nitride (SiN).

FIG. 1B further shows a replacement gate electrode film 114 deposited on the first cap layer 108 and on the second cap layer 106. The replacement gate electrode film 114 can, for example, contain silicon (e.g., poly-Si or amorphous Si), a metal, or a metal nitride.

Although not shown in FIG. 1B, a barrier layer containing, for example, one or more of TiN, TiC, TiCN, TiAlN, TiSiN, TaN, TaC, TaCN, TaAlN, TaSiN, amorphous Si, or poly-Si, may be formed on the first cap layer 108 and on the second cap layer 106, below or above the replacement gate electrode film 114. A thickness of the barrier layer can be between about 50 and 200 Angstrom, for example. The barrier layer can provide physical separation of the first cap layer 108 and the second cap layer 106 from any subsequent layers formed on the barrier film, such as a mask layer or photoresist. The barrier layer can prevent or significantly reduce oxygen diffusion into the first cap layer 108 and the second cap layer 106 from a gaseous environment during heat-treating processes.

Figure 1C:
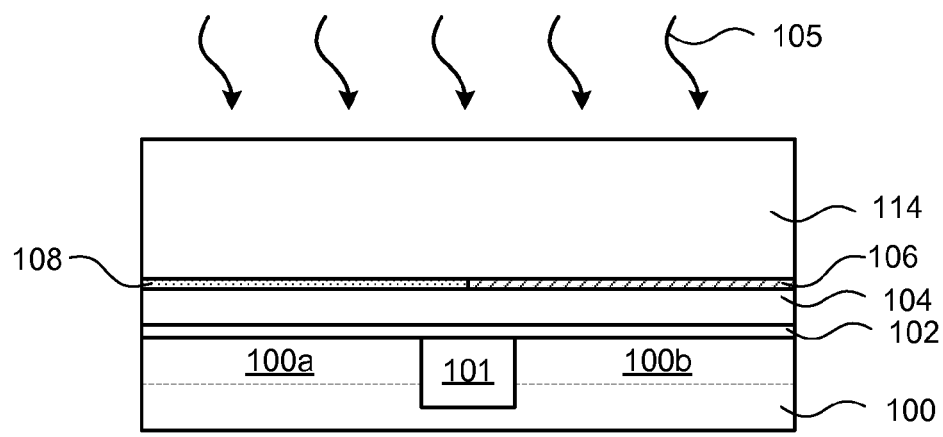

FIG. 1C schematically shows a high-temperature heat-treating process 105 that is performed to diffuse a first chemical element from the first cap layer 108 into the first high-k film 104 in the first device region 100a and to diffuse a second chemical element from the second cap layer 106 into the first high-k film 104 in the second device region 100b. Although the heat-treating process 105 schematically shows heat being applied from above the substrate 100, those skilled in the art will readily realize that heat may alternatively or additionally applied to the underside of substrate 100.

The heat-treating process 105 may utilize a substrate temperature, time, and gaseous environment (e.g., an inert gaseous environment containing a noble gas or $N_2$), that results in a targeted diffusion of the first chemical element (e.g., La or Ba) from the first cap layer 108 into the first high-k film 104 in the first device region 100a, and diffusion of the second chemical element (e.g., Al) into the first high-k film 104 in the second device region 100b. In one example, the heat-treating may include a rapid thermal anneal (RTA) with a fast positive temperature ramping rate to a target temperature between about 800° C. and 1200° C., in an inert gaseous atmosphere, followed by a hold at the target temperature, and subsequent rapid temperature ramp down. However, other target temperatures may be used, for example between about 900° C. and 1100° C., or between 1000° C. and 1200° C.

Figure 1D:
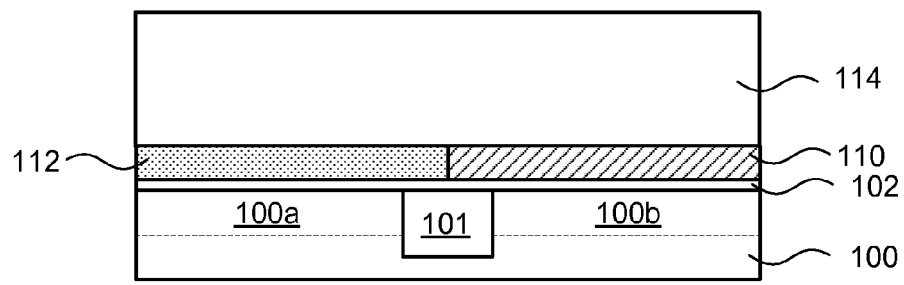
Figure 1E:
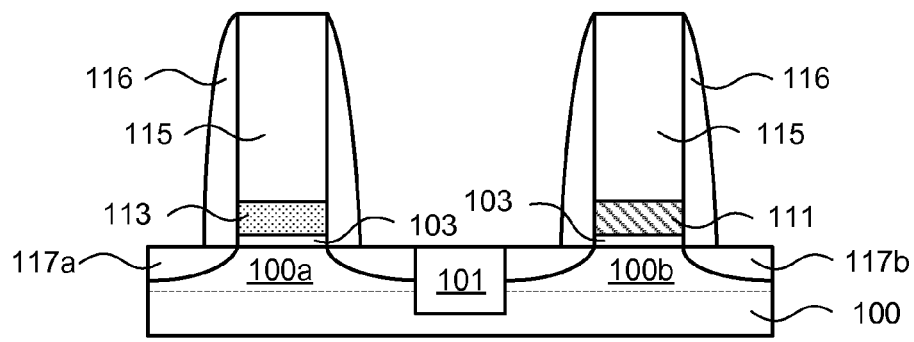

FIG. 1D schematically shows the resulting film structure following the heat-treating process 105. The diffusion of the first chemical element from the first cap layer 108 into the first high-k film 104 in the first device region forms a first modified high-k film 112, and diffusion of the second chemical element into the first high-k film 104 in the second device region 100b forms a second modified high-k film 110.

The chemical modification of the first high-k film 104 in the first device region 100a may be suitable for tuning the effective workfunction of a gate stack that is formed in the first device region (e.g., a NMOS device) and the chemical modification of the first high-k film 104 in the second device region 100b may be suitable for tuning the effective workfunction of a gate stack that is formed in the second device region (e.g., a PMOS device).

After the heat-treating process 105, further processing can include a conventional replacement-gate (gate last) integration scheme that is schematically shown in FIGS. 1E-1H. The processing includes patterning the replacement gate electrode film 114 in the first device region 100a and in the second device region 100b to form patterned replacement gate electrode films 115, patterning the first modified high-k film 112 to form patterned first modified high-k film 113, patterning the second modified high-k film 110 to form a patterned second modified high-k film 111, and patterning the interface layer 102 to form patterned interface layers 103. The processing further includes forming doped regions 117a and 117b in the substrate 100, and forming sidewall spacers 116 adjacent the patterned replacement gate electrode films 115. The sidewall spacers 116 can include an insulating material such as $SiO_2$, SiN, or SiON.

Figure 1F:
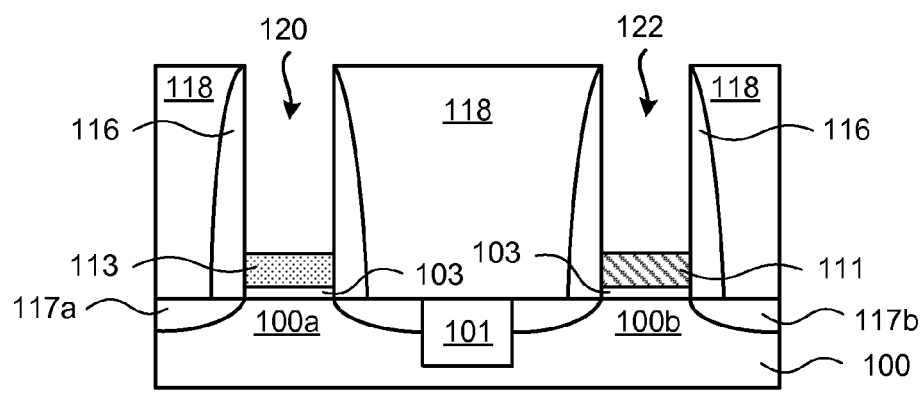

Thereafter, as depicted in FIG. 1F, a planarized dielectric film 118 is formed over the structure shown in FIG. 1 E, and the patterned replacement gate electrode films 115 are removed by dry or wet etching to form recessed features 120 and 122 that are defined by the sidewall spacers 116 and the patterned first modified high-k film 113 and the patterned second modified high-k film 111.

Figure 1G:
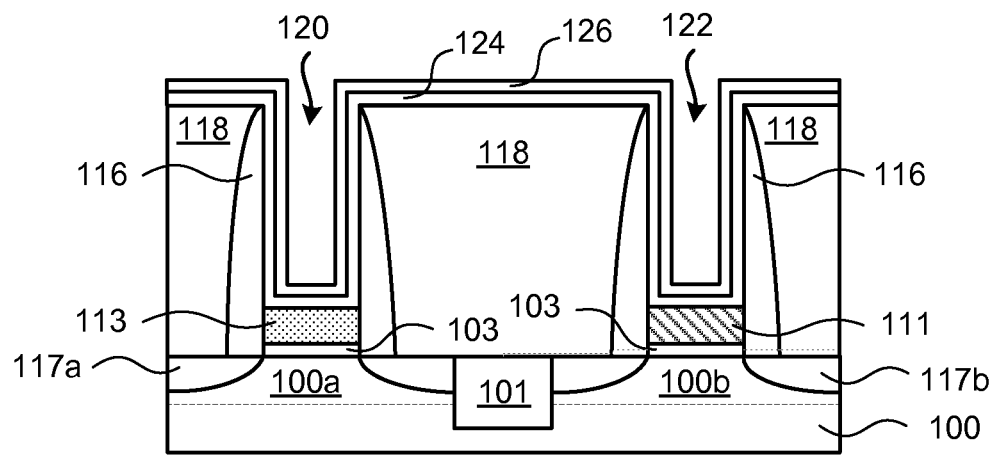

FIG. 1G schematically shows a second high-k film 124 that is conformally deposited over the structure in FIG. 1F, including inside the recessed features 120 and 122. The second high-k film 124 may contain or consist of one or more of the dielectric materials described above for the first high-k film 104. According to one embodiment, the first high-k film 104 and the second high-k film 124 can contain the same dielectric material, for example $HfO_2$. According to another embodiment, the second high-k film 124 may contain or consist of a dielectric material (e.g., $La_2O_3$) that has a higher dielectric constant than the dielectric material of the first high-k film 104 (e.g., $HfO_2$), the patterned first modified high-k film 113, and the patterned second modified high-k film 111.

The second high-k film 124 may be heat-treated using a substrate temperature, time, and gaseous environment (e.g., an inert gaseous environment containing a noble gas or $N_2$), that improves the material and electrical properties of the second high-k film 124. According to embodiments of the invention, the second high-k film 124 may be heat-treated a lower temperature than the heat-treating process 105 of the first high-k film 104. In one example, the heat-treating of the second high-k film 124 may include a rapid thermal anneal (RTA) with a fast positive temperature ramping rate to a target temperature between about 600° C. and 800° C., in an inert gaseous atmosphere, followed by a hold at the target temperature, and subsequent rapid temperature ramp down. However, other target temperatures may be used, for example between about 400° C. and 800° C., or between 400° C. and 600° C.

The high-temperature heat-treating of the first high-k film 104 has the characteristics of a gate-first integration scheme and the low-temperature heat-treating of the second high-k film 124 has the characteristics of a gate-last integration scheme. The high-temperature heat-treating of the first high-k film 104 enables chemical modification of the first high-k film 104 in the first device region 100a and in the second device region 100b and the low-temperature heat-treating of the second high-k film 124 allows for further tuning the effective workfunction of a gate stack that is formed in the first device region (e.g., a NMOS device) and for tuning the effective workfunction of a gate stack that is formed in the second device region (e.g., a PMOS device).

Still referring to FIG. 1G, a gate electrode film 126 may be formed on the second high-k film 124 before or following the heat-treating of the second high-k film 124. The gate electrode film 126 can, for example, have a thickness between about 5 nm (nanometers) and about 40 nm, or between about 5 nm and about 10 nm and can contain W, WN, $WSi_x$, Al, Mo, Ta, TaN, TaSiN, HfN, HfSiN, Ti, TiN, TiSiN, Mo, MoN, Re, Pt, Ru, or Si.

Figure 1H:
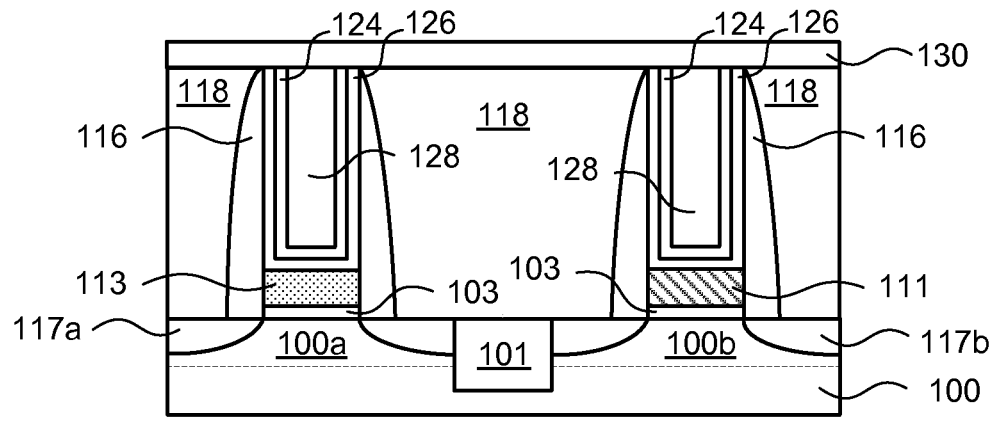

Following the deposition of the gate electrode film 126, planarized bulk Al metal 128 may be used to fill the recessed features 120 and 122, and a dielectric film 130 may be deposited on the planarized film structure. The dielectric film can, for example, contain SiN, SiC, or SiCN. The resulting film structure is schematically shown in FIG. 1H.

Figure 2:
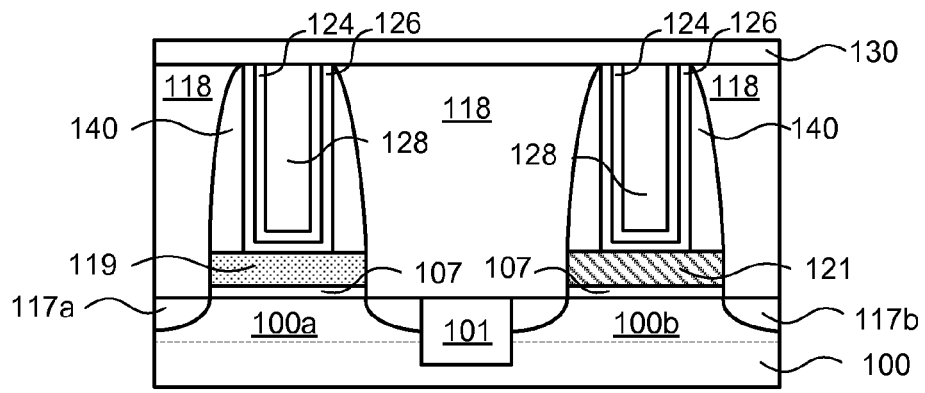
FIGS. 2-4 show schematic cross-sectional views of semiconductor devices formed according to other embodiments of the invention.

FIG. 2 shows a schematic cross-sectional view of a semiconductor device formed according to another embodiment of the invention. The semiconductor device in FIG. 2 is similar to the semiconductor device in FIG. 1H but differs in that the sidewall spacers 140 are positioned on a patterned first modified high-k film 119, on a patterned second modified high-k film 121, and on a patterned interface layers 103, compared to the sidewall spacers 116 which are formed adjacent the patterned first modified high-k film 113, the patterned second modified high-k film 111, and the patterned interface layer 107. The structure depicted in FIG. 2 may be formed by using the first modified high-k film 112 and the second modified high-k film 110 as etch stops during patterning of the replacement gate electrode film 114, and thereafter forming the sidewall spacers 140 on the patterned first modified high-k film 119 and on the patterned second modified high-k film 121.

Figure 3:
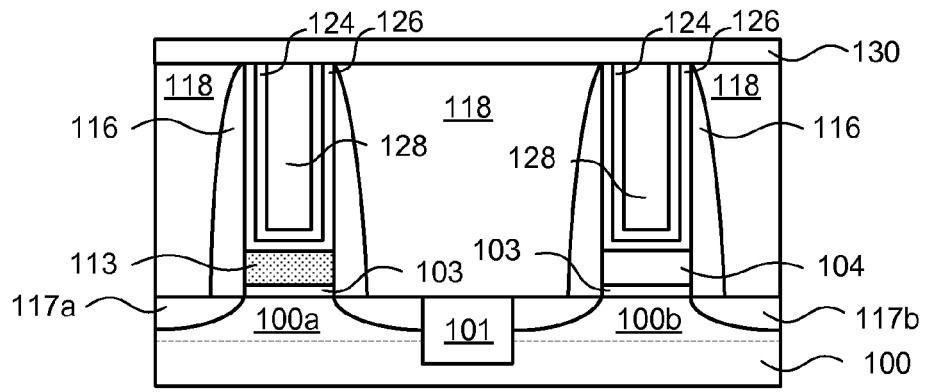

FIG. 3 shows a schematic cross-sectional view of a semiconductor device formed according to another embodiment of the invention. The semiconductor device in FIG. 3 is similar to the semiconductor device in FIG. 1H but differs in that the first high-k film 104 is not modified by diffusion of a second chemical element in the second device region 100b. This can be achieved by omitting the second cap layer 106 shown in FIGS. 1B-1C.

Figure 4:
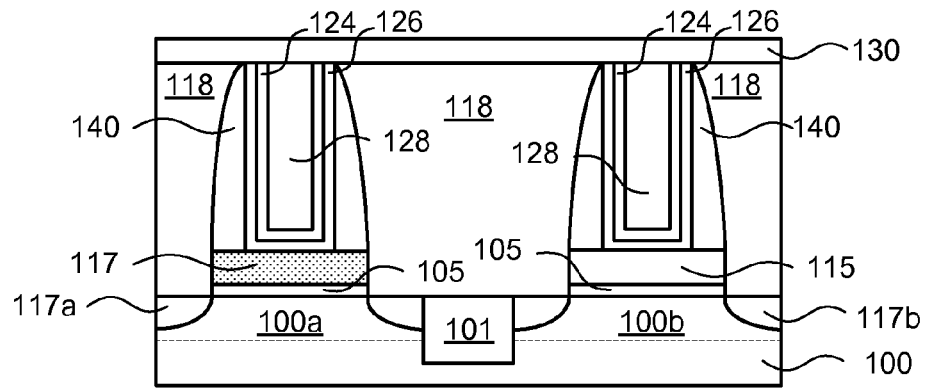

FIG. 4 shows a schematic cross-sectional view of a semiconductor device formed according to another embodiment of the invention. The semiconductor device in FIG. 4 is similar to the semiconductor device in FIG. 2 but differs in that the first high-k film 104 is not modified by diffusion of a second chemical element in the second device region 100b. This can be achieved by omitting the second cap layer 106 shown in FIGS. 1B-1C.

FIGS. 5A-5G show schematic cross-sectional views of a process flow for forming a semiconductor device according to an embodiment of the invention. The process flow shown in FIGS. 5A-5G is similar to the process flow shown in FIGS. 1A-1H, and for the sake of brevity, description of all the same or similar processing steps and materials will not be repeated.

Figure 5A:
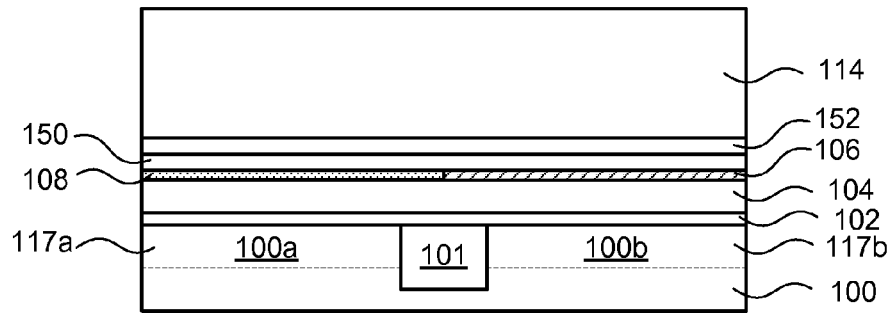
FIGS. 5A-5F show schematic cross-sectional views of a process flow for a forming a semiconductor device according to an embodiment of the invention.

The film structure in FIG. 5A is similar to the film structure in FIG. 1A but further includes a barrier layer 150 on the first modified high-k film 112 and on the second modified high-k film 110, and an oxygen scavenging layer 152 on the barrier layer 150. FIG. 5A further shows replacement gate electrode film 114 deposited on the oxygen scavenging layer 152.

The oxygen scavenging layer 152 contains a chemical element capable of scavenging oxygen from the materials shown in FIG. 5A, including from the interface layer 102. The oxygen scavenging layer 152 can include a metal layer (i.e., zero valent metal). The oxygen scavenging layer 152 may be selected from Ti, Ta, Al, Ga, Mg, Ca Sr, Ba, Sc, Y, La, Ce, Pr, Nd, Pm, Sm, Eu, Gd, Tb, Dy, Ho, Er, Tm, Yb, or Lu, or a combination thereof. The thickness of the oxygen scavenging layer 152 may be selected to provide desired reduction or elimination of the interface layer 102 by scavenging of oxygen by the chemical element in the oxygen scavenging layer 152. The reduction or elimination of the interface layer 102 occurs by oxygen diffusion from the interface layer 102 into the oxygen scavenging layer 152 during a heat-treating process.

The barrier layer 150 can, for example, include one or more of TiN, TiC, TiCN, TiAlN, TiSiN, TaN, TaC, TaCN, TaAlN, TaSiN, amorphous Si, or poly-Si. A thickness of the barrier film can be between about 50 and 200 Angstrom, for example. The barrier layer 150 can provide physical separation of the first cap layer 108 and the second cap layer 106 from any subsequent layers formed on the barrier film, such as a mask layer or photoresist. The barrier layer 150 can prevent or significantly reduce oxygen diffusion into the first cap layer 108 and the second cap layer 106 from a gaseous environment during heat-treating processes. According to another embodiment, the barrier layer 150 may be omitted.

Figure 5B:
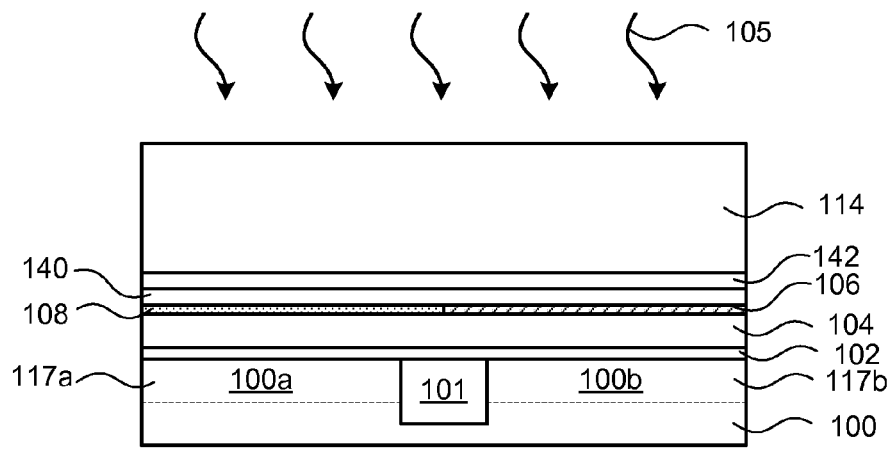

FIG. 5B schematically shows a high-temperature heat-treating process 105 that is performed to diffuse a first chemical element from the first cap layer 108 into the first high-k film 104 in the first device region 100a and to diffuse a second chemical element from the second cap layer 106 into the first high-k film 104 in the second device region 100b. Further, during the heat-treating process 105, oxygen species diffuse from the interface layer 102 (e.g., $SiO_2$), through the first high-k film 104, the first cap layer 108, the second cap layer 106, and the barrier layer 150, into the oxygen scavenging layer 152, thereby reducing the thickness of or eliminating the interface layer 102. Further, the oxygen scavenging layer 152 may scavenge oxygen diffusing through other material layers from a gaseous processing environment during the heat-treating process 105. This oxygen scavenging maintains a constant or nearly constant device threshold voltage, even after high-temperature heat-treating process 105 or anneal in an oxygen ambient. By reducing the thickness of or eliminating the interface layer 102 altogether, the effective oxide thickness (EOT) of the composite gate stack is reduced, thereby, enhancing the scalability of the composite gate stack and performance of the field effect transistor.

Figure 5C:
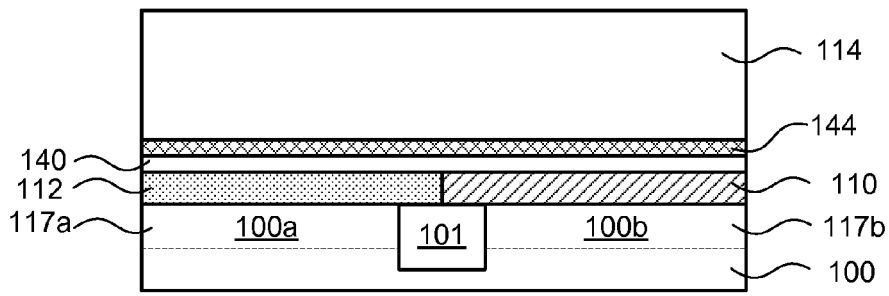

FIG. 5C schematically shows the resulting film structure following the heat-treating process. The diffusion of the first chemical element from the first cap layer 108 into the first high-k film 104 in the second device region forms a first modified high-k film 112, and diffusion of the second chemical element into the first high-k film 104 in the second device region 100b forms a second modified high-k film 110. The interface layer 102 from FIG. 5B is reduced in thickness or eliminated by the scavenging properties of the oxygen scavenging layer 142. Further, the oxygen scavenging layer 142 is oxidized to form an oxidized layer 144.

Figure 5D:
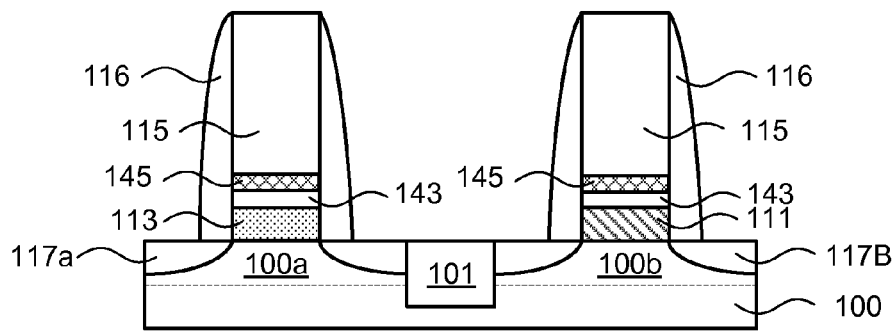
Figure 5E:
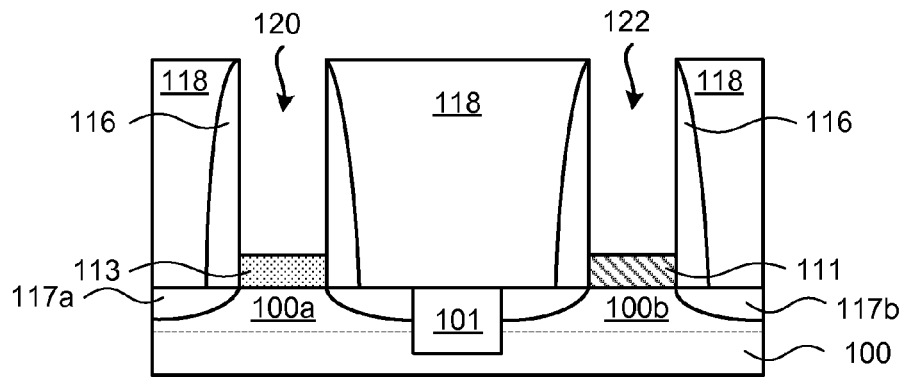

After the heat-treating process 105, further processing can include conventional replacement-gate (gate last) integration scheme. The processing includes patterning the replacement gate electrode film 114 in the first device region 100a and in the second device region 100b, patterning the oxidized layer 144, the first modified high-k film 112, and the second modified high-k film 110, forming doped regions 117a and 117b in the substrate 100, forming sidewall spacers 116 adjacent the patterned replacement gate electrode films 115. The resulting structure is schematically shown in FIG. 5D Thereafter, as depicted in FIG. 5E, a planarized dielectric film 118 is formed over the structure in FIG. 5D, and the patterned replacement gate electrode films 115 are removed by dry or wet etching to form recessed features 120 and 122 that are defined by the sidewall spacers 116, the patterned first modified high-k film 113, and the patterned second modified high-k film 111.

Figure 5F:
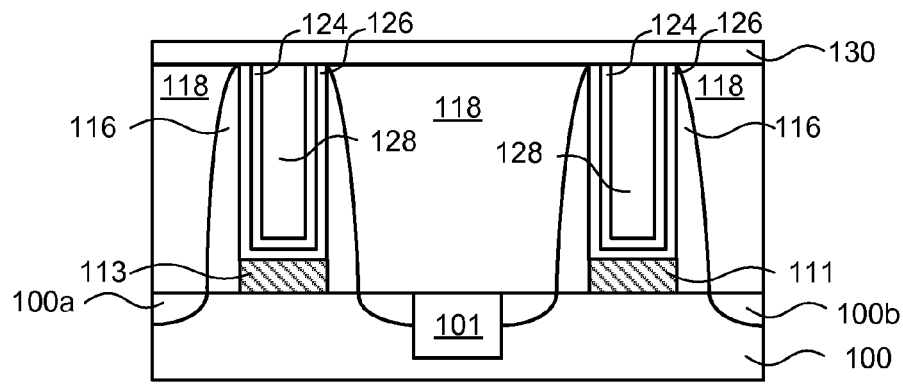

Next, the structure is further processed as describe above in FIGS. 1G-1H to form the semiconductor device schematically shown in FIG. 5F.

Figure 6:
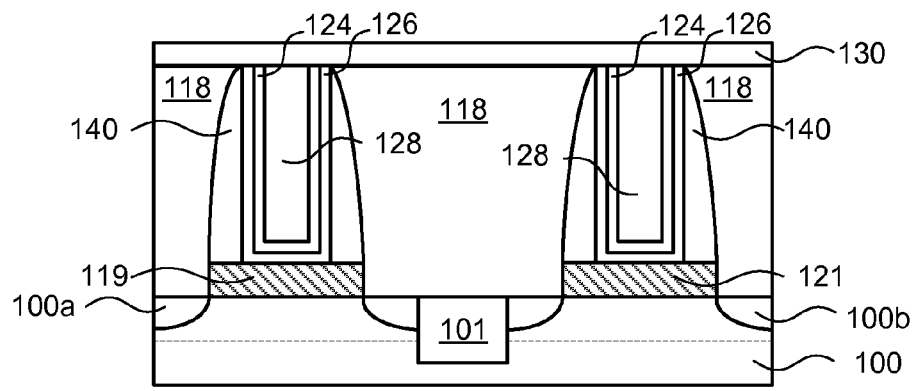
FIGS. 6-8 show schematic cross-sectional views of semiconductor devices formed according to other embodiments of the invention.

FIG. 6 shows a schematic cross-sectional view of a semiconductor device formed according to another embodiment of the invention. The semiconductor device in FIG. 6 is similar to the semiconductor device in FIG. 5H but differs in that the sidewall spacers 140 are positioned on a patterned first modified high-k film 119 and on a patterned second modified high-k film 121, compared to the sidewall spacers 116 which are formed adjacent the patterned first modified high-k film 113 and the patterned second modified high-k film 111. The structure depicted in FIG. 6 may be achieved by using the first modified high-k film 112 and the second modified high-k film 110 as etch stops during patterning of the replacement gate electrode film 114, and thereafter forming the sidewall spacers 140 on the patterned first modified high-k film 119 and on the patterned second modified high-k film 121.

Figure 7:
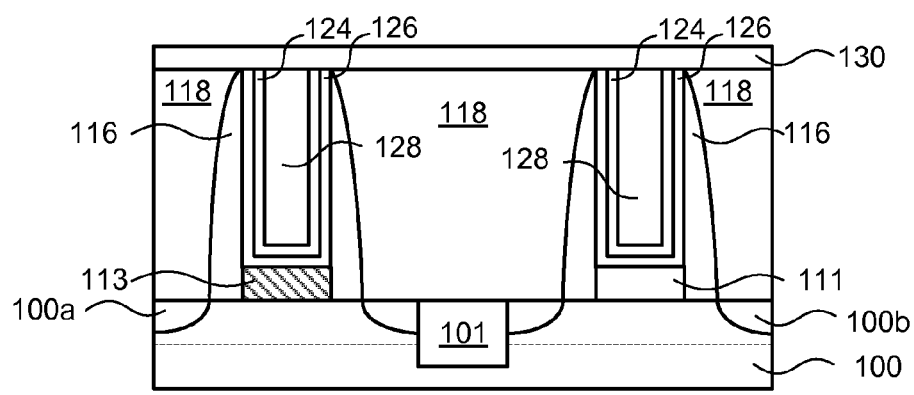

FIG. 7 shows a schematic cross-sectional view of a semiconductor device formed according to another embodiment of the invention. The semiconductor device in FIG. 7 is similar to the semiconductor device in FIG. 5F but differs in that the first high-k film 104 is not modified by diffusion of a second chemical element in the second device region 100b. This can be achieved by omitting the second cap layer 106 shown in FIGS. 5A-5B.

Figure 8:
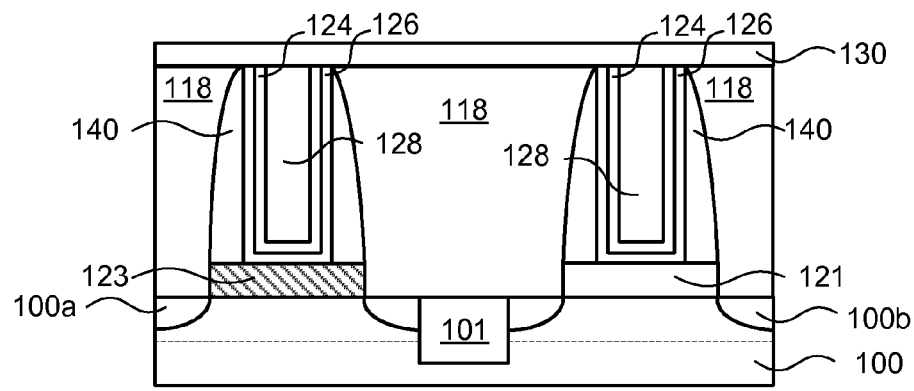

FIG. 8 shows a schematic cross-sectional view of a semiconductor device formed according to another embodiment of the invention. The semiconductor device in FIG. 8 is similar to the semiconductor device in FIG. 6 but differs in that the first high-k film 104 is not modified by diffusion of a second chemical element in the second device region 100b. This can be achieved by omitting the second cap layer 106 shown in FIGS. 5A-5B.

A plurality of embodiments for a semiconductor device and a method for forming a semiconductor device has been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate unless otherwise specified.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, comprising:
   providing a substrate containing first and second device regions and an interface layer on the substrate;
   depositing a first high-k film on the interface layer in the first and second device regions;
   forming a first cap layer containing a first chemical element on the first high-k film in the first device region;
   depositing a replacement gate electrode film in the first and second device regions;
   heat-treating the first high-k film at a first heat-treating temperature to diffuse the first chemical element from the first cap layer into the first high-k film in the first device region to form a first modified high-k film;
   patterning the replacement gate electrode film in the first and second device regions;
   forming sidewall spacers adjacent the patterned replacement gate electrode film;
   removing the patterned replacement gate electrode film to form recessed features defined by the sidewall spacers in the first and second device regions;
   depositing a second high-k film in the recessed features;
   heat-treating the second high-k film at a second heat-treating temperature that is lower than the first heat-treating temperature; and
   depositing a gate metal film on the second high-k film.

2. The method of claim 1, wherein the first cap layer includes a dielectric material and the first chemical element is selected from Mg, Ca Sr, Ba, Sc, Y, La, Ce, Pr, Nd, Pm, Sm, Eu, Gd, Tb, Dy, Ho, Er, Tm, Yb, or Lu, or a combination thereof.

3. The method of claim 1, wherein the patterning the replacement gate electrode film further comprises patterning the first modified high-k film.

4. The method of claim 1, further comprising:
   forming a second cap layer containing a second chemical element on the high-k film in the second device region, wherein the second chemical element is different from the first chemical element, and wherein the heat-treating the first high-k further diffuses the second chemical element from the second cap layer into the first high-k film in the second device region to form a second modified high-k film.

5. The method of claim 4, wherein the second cap layer includes a metal layer and the second chemical element is selected from Ti, Ta, Al, Ga, Mg, Ca Sr, Ba, Sc, Y, La, Ce, Pr, Nd, Pm, Sm, Eu, Gd, Tb, Dy, Ho, Er, Tm, Yb, or Lu, or a combination thereof.

6. The method of claim 4, further comprising:
forming an oxygen scavenging layer on the first high-k film, wherein the heat-treating the first high-k film further scavenges oxygen from the interface layer to eliminate or reduce the thickness of the interface layer.

7. The method of claim 6, wherein the oxygen scavenging layer is selected from Ti, Ta, Al, Ga, Mg, Ca Sr, Ba, Sc, Y, La, Ce, Pr, Nd, Pm, Sm, Eu, Gd, Tb, Dy, Ho, Er, Tm, Yb, or Lu, or a combination thereof.

8. The method of claim 1, wherein the substrate further comprises a shallow trench isolation (STI) that separates the first and second device regions.

9. The method of claim 1, wherein the first and second device regions include dopant regions for NMOS and PMOS.

10. The method of claim 1, further comprising:
forming an oxygen scavenging layer on the first cap layer, wherein the heat-treating the first high-k film scavenges oxygen from the interface layer to eliminate or reduce the thickness of the interface layer.

11. The method of claim 10, wherein the oxygen scavenging layer is selected from Ti, Ta, Al, Ga, Mg, Ca Sr, Ba, Sc, Y, La, Ce, Pr, Nd, Pm, Sm, Eu, Gd, Tb, Dy, Ho, Er, Tm, Yb, or Lu, or a combination thereof.

12. The method of claim 10, further comprising
forming a second cap layer containing a second chemical element on the high-k film in the second device region, wherein the second chemical element is different from the first chemical element, and wherein the heat-treating the first high-k further diffuses the second chemical element from the second cap layer into the first high-k film in the second device region to form a second modified high-k film.

13. The method of claim 12, wherein the second cap layer includes a metal layer and the second chemical element is selected from Ti, Ta, Al, Ga, Mg, Ca Sr, Ba, Sc, Y, La, Ce, Pr, Nd, Pm, Sm, Eu, Gd, Tb, Dy, Ho, Er, Tm, Yb, or Lu, or a combination thereof.

14. The method of claim 12, wherein patterning the replacement gate film further comprises patterning the second modified high-k film.

15. A semiconductor device formed by the method of claim 1.

16. A method of forming a semiconductor device, comprising:
providing a substrate containing first and second device regions and an interface layer on the substrate;
depositing a first high-k film on the interface layer in the first and second device regions;
forming a first cap layer containing a first chemical element on the first high-k film in the first device region;
forming a second cap layer containing a second chemical element on the high-k film in the second device region, wherein the second chemical element is different from the first chemical element;
forming an oxygen scavenging layer on the first and second cap layers;
depositing a replacement gate electrode film in the first and second device regions;
heat-treating the first high-k film at a first heat-treating temperature to diffuse the first chemical element from the first cap layer into the first high-k film in the first device region to form a first modified high-k film and to diffuse the second chemical element from the second cap layer into the first high-k film in the second device region to form a second modified high-k film, wherein the heat-treating the first high-k film further scavenges oxygen from the interface layer to eliminate or reduce the thickness of the interface layer;
patterning the replacement gate electrode film in the first and second device regions;
forming sidewall spacers adjacent the patterned replacement gate electrode film;
removing the patterned replacement gate electrode film to form recessed features defined by the sidewall spacers in the first and second device regions;
depositing a second high-k film in the recessed features; and
depositing a gate metal film on the second high-k film.

17. The method of claim 16, wherein the first cap layer includes a dielectric material and the first chemical element is selected from Mg, Ca Sr, Ba, Sc, Y, La, Ce, Pr, Nd, Pm, Sm, Eu, Gd, Tb, Dy, Ho, Er, Tm, Yb, or Lu, or a combination thereof.

18. The method of claim 16, wherein the second cap layer includes a metal layer and the second chemical element is selected from Ti, Ta, Al, Ga, Mg, Ca Sr, Ba, Sc, Y, La, Ce, Pr, Nd, Pm, Sm, Eu, Gd, Tb, Dy, Ho, Er, Tm, Yb, or Lu, or a combination thereof.

19. The method of claim 16, wherein the oxygen scavenging layer is selected from Ti, Ta, Al, Ga, Mg, Ca Sr, Ba, Sc, Y, La, Ce, Pr, Nd, Pm, Sm, Eu, Gd, Tb, Dy, Ho, Er, Tm, Yb, or Lu, or a combination thereof.

20. The method of claim 16, further comprising
heat-treating the second high-k film at a second heat-treating temperature that is lower than the first heat-treating temperature.

21. A method of forming a semiconductor device, comprising:
providing a substrate containing first and second device regions and an interface layer on the substrate;
depositing a first high-k film on the interface layer in the first and second device regions;
forming a first cap layer containing a first chemical element on the first high-k film in the first device region;
forming an oxygen scavenging layer on the first cap layer;
depositing a replacement gate electrode film in the first and second device regions;
heat-treating the first high-k film at a first heat-treating temperature to diffuse the first chemical element from the first cap layer into the first high-k film in the first device region to form a first modified high-k film, and wherein the heat-treating the first high-k film scavenges oxygen from the interface layer to eliminate or reduce the thickness of the interface layer;
patterning the replacement gate electrode film in the first and second device regions;
forming sidewall spacers adjacent the patterned replacement gate electrode film;
removing the patterned replacement gate electrode film to form recessed features defined by the sidewall spacers in the first and second device regions;
depositing a second high-k film in the recessed features; and
depositing a gate metal film on the second high-k film.

* * * * *